(12) United States Patent
Cischke

(10) Patent No.: US 7,386,434 B1
(45) Date of Patent: Jun. 10, 2008

(54) METHOD AND APPARATUS FOR CREATING INTEGRATED CIRCUIT SIMULATOR TEST SOURCE FILES

(75) Inventor: Christopher M. Cischke, Shoreview, MN (US)

(73) Assignee: Unisys Corporation, Blue Bell, PA (US)

( * ) Notice: Subject to any disclaimer, the term of this patent is extended or adjusted under 35 U.S.C. 154(b) by 641 days.

(21) Appl. No.: 10/783,816

(22) Filed: Feb. 20, 2004

(51) Int. Cl.
*G06F 17/50* (2006.01)

(52) U.S. Cl. .................................... 703/14
(58) Field of Classification Search ............. 703/14
See application file for complete search history.

(56) References Cited

U.S. PATENT DOCUMENTS

| | | | |
|---|---|---|---|
| 5,386,579 A * | 1/1995 | Bourekas et al. | 712/43 |
| 6,182,258 B1 * | 1/2001 | Hollander | 714/739 |
| 6,446,241 B1 * | 9/2002 | Mobley et al. | 716/4 |
| 6,968,520 B2 * | 11/2005 | Kawabe et al. | 716/5 |
| 2001/0001157 A1 * | 5/2001 | Oura | 714/42 |
| 2004/0181655 A1 * | 9/2004 | Azuma | 712/241 |
| 2005/0060132 A1 * | 3/2005 | Hollander et al. | 703/14 |

OTHER PUBLICATIONS

David A. Wood et al.; "Verifying a multiprocessor cache controller using random test generation", Aug. 1990, IEEE Design and Test of Computers, vol. 7, Issue 4, pp. 13-25.*

Donald E. Knuth, "The Art of Computer Programming", vol. 2/Seminumerical Algorithms, Third Edition, 1998, Addison Wesley Longman, pp. 26-28.*

A. Chandra et al.; "AVPGEN—A Test Generator for Architecture Verification", Jun. 1995, IEEE Transactions on Very Large Scale Integration Systems, vol. 3, No. 2, pp. 188-200.*

* cited by examiner

*Primary Examiner*—Paul L Rodriguez
*Assistant Examiner*—Russ Guill
(74) *Attorney, Agent, or Firm*—Charles A. Johnson; Robert Marley; Shumaker & Sieffert, PA

(57) ABSTRACT

An apparatus and method for generating test files for design verification of a simulated integrated circuit design such as a cache memory circuit, that involve steps of creating a series of functions, updating a data integrity buffer after each function is created, creating a series of integrity check functions from the data in the data integrity buffer, and writing the series of functions and the series of integrity check functions to a test file. This file can be compiled if necessary and executed by a software or hardware simulator.

22 Claims, 8 Drawing Sheets

METHOD AND APPARATUS FOR CREATING INTEGRATED CIRCUIT SIMULATOR TEST SOURCE FILES

FIELD OF THE INVENTION

The invention relates generally to design verification systems for integrated circuits. More particularly, it relates to systems for verification testing of integrated circuit designs operating on hardware or software simulators. Even more particularly, it relates to the methods for creating integrated circuit functional verification test files.

BACKGROUND OF THE INVENTION

Modern integrated circuits may have millions of transistors or "gates" created on monolithic substrates of silicon. These circuits, perhaps two tenths of an inch square, are quite complex in their internal organization. This complexity makes it difficult to test whether they are functioning properly in accordance with their design, and also whether the design itself was without errors. Early testing of the design on integrated circuit simulators is quite important, since the cost of having to correct a flawed design after the integrated circuit is already being manufactured can be extremely high.

For this reason, integrated circuit designs are put through a rigorous design testing process before the circuits are manufactured. This process is called "design verification" and it is performed in software or hardware simulators that are configured to imitate the operation of the integrated circuit.

Each succeeding generation of integrated circuits poses new design verification problems. Following Moore's law, design complexity is doubling every 12-18 months, which causes design verification complexity to increase at an exponential rate. In addition, competitive pressures increasingly demand shorter time to market. The combination of these forces has caused an ever worsening "verification crisis".

Simulation-based functional verification is by far the most popular method of functional verification today, and is widely used within the digital design industry as a method for finding defects within designs. A wide variety of products are available in the market to support simulation-based verification methodologies. However, a fundamental problem with conventional simulation-based verification approaches is that they are slow and often do not uncover all design errors due to the unavoidable shallowness of the tests and the limited time available to run simulations.

One such limitation that is of particular concern for the testing of cache memory devices is the inability to determine design errors resulting in corrupted data in cache memory locations and the effect on subsequent cache memory operations.

For example, one common cache memory test is to write data to a cache memory location, to read back the contents of the memory location, and to compare the actual results of the read with the intended results. In this test, the results that are read back should be the same as the intended result, i.e. the number that was originally written to the memory location. This test will uncover simple apparent errors in the design, but it may not identify other, deeper design errors.

Some deeper design errors that may cause corruption of data stored in cache memory locations may not appear immediately, but only after a predetermined number or sequence or type of cache memory operations.

To uncover such errors, it would be beneficial to test a cache memory device by (1) writing data to a cache memory location, (2) performing many cache memory operations that should have no effect on that written-to cache memory location, and then (3) reading back the contents of the written-to cache memory location and comparing it with the data originally stored.

It would also be beneficial to have a program that would automatically generate a variety of cache memory operations in no predetermined order, while keeping track of all cache memory write functions and cache memory contents.

It would also be desirable to have a test system that would write data to a memory location with a first function, apply several other second functions that (according to the design of the cache memory device) do not affect that memory location, and then follow up with a third function that checks the memory location to see whether the second functions erroneously changed the value of the memory location.

It would also be desirable to have a test settings file containing test parameters to select whether data verification should be performed or not.

SUMMARY OF THE INVENTION

A method and apparatus are described to create test files for testing functionality of integrated circuit designs.

According to a first aspect of an invention, a test file containing many sequential functions can be created by a novel test file creation process that helps verify integrity of test data written to memory locations.

According to a second aspect of the invention, a digital storage medium stores instructions for executing a test file creation process that helps verify integrity of test data written to memory locations.

According to a third aspect of the invention, a digital computer is configured to prepare a test source file for verifying the performance of a simulated cache memory integrated circuit device design. The computer includes a means for sequentially creating a series of functions; a means for updating a data integrity buffer in the computer after each function of the series of functions is created; a means for creating a series of integrity check functions from data in the data integrity buffer; and a means for writing the series of functions and the series of integrity check functions to a test file.

The computer may also include a means for providing test settings to the means for sequentially creating the series of functions. The data integrity buffer may include a plurality of records, and each record may include a cache memory address associated with contents of that cache memory address.

Further, the digital computer may include a means for randomly generating an address of each record. Contents of each record may be generated at random.

The computer may include a means for updating the data integrity buffer, and the means for updating the data integrity buffer may further include means for updating the data integrity buffer after a normal function is created in said series of functions. In addition, the means for providing test settings to the means for sequentially creating the series of instructions may include a means for directing the generation of prefetch loops.

The test generation begins by opening a test settings file containing parameters of the tests to be created. These parameters preferably include descriptions of the desired types, numbers and probabilities of tests to be created.

Based on the parameters in the test settings file, a test file generation program generates a sequence of functions that write to integrated circuit memory locations. As each function is created by the program, the program creates corresponding entries in a data integrity buffer indicating which memory locations have been changed and what was changed in those locations. The sequence of functions may be randomly created based on parameters in the test settings file.

Once a predetermined number of functions is generated, the functions are written to a test file together with integrity checking functions that will verify the contents of the integrated circuit memory locations.

The test file is later executed (directly or after compilation or other conversion) by a simulator which actually executes the tests.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION

Terminology

Figure 4:
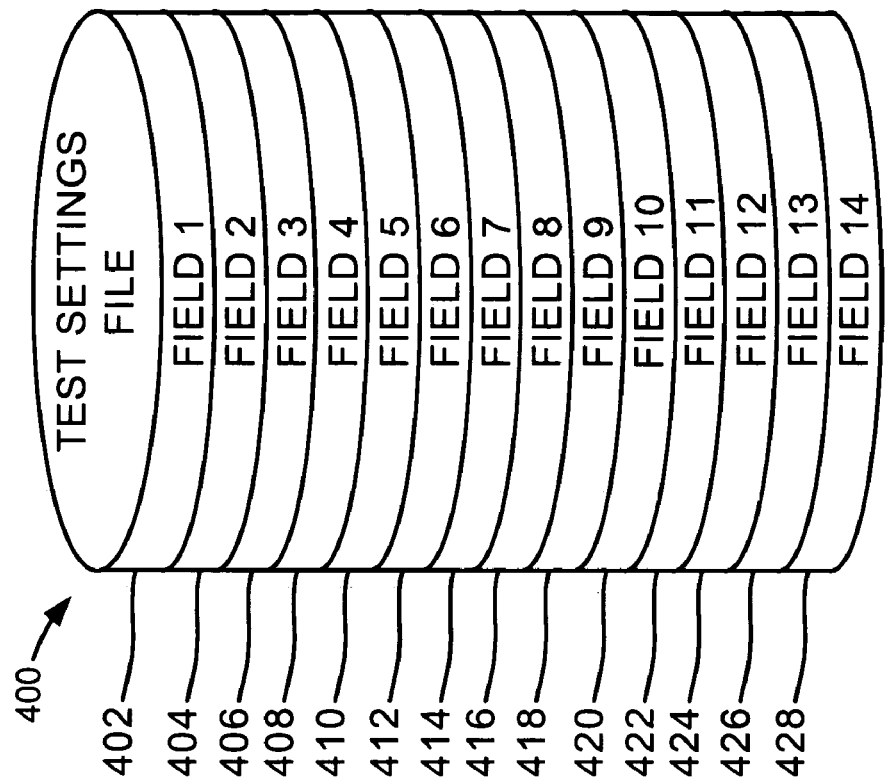
FIG. 4 illustrates the structure of the test settings file prepared as the first step of the testing process of FIG. 3.

Before describing an illustrative design verification environment in which various embodiments of the present invention may be implemented, brief definitions of terms used throughout this application are given below.

A "design" is defined as a description of a collection of objects, such as modules, blocks, wires, registers, and components that represent elements of a logic circuit.

A design may be expressed in the form of a language. For example, a hardware description language (HDL), such as Verilog or VHDL can be used to describe the behavior of hardware as well as its implementation.

As used herein, "simulation" is defined as the process of evaluating design behavior for a set of input conditions to draw approximate conclusions about the behavior of many different attributes of the design.

"Hardware simulator" is defined as a simulator in which the operation of the design under test is programmed into many integrated circuits called "gate arrays", which imitate the interactive operation of individual circuits in the design.

The advantage to performing hardware simulations on a hardware simulator is that multiple programmed gate arrays can change state simultaneously, speeding up the simulation process.

"Software simulator" is defined as a simulator in which the simulation of the operation of the design under test is provided by a general purpose computer having one or more central processing units that are programmed to calculate state transitions for the individual circuits (or predefined collections of circuits) of the design. The disadvantage of software simulations and software simulators is that every state transition of a circuit must be individually calculated by a limited number of central processing units.

"Functional verification" is defined as the process of applying stimuli to a design under test with appropriate checking mechanisms to either detect a defect in the design or to establish that the functionality performs as expected. Typically, the three key components of a functional verification process are the applied stimulus, the checking mechanism, and the user's ability to both run the process and debug the results.

A "function" is defined as a command given to a hardware or software simulator to direct the simulator to perform a predetermined activity. A function has a description, and may have one or more parameters associated with it.

A "normal function" is defined as a function that the simulator treats as an input to stimulate the simulated portion of the integrated circuit. For example, an actual cache memory device has a command set to which it responds. Such commands sets typically include (as just one example) a command to write a specific value to a specific cache memory location. In this instance, the description of the function is a "write" command, and the parameters would be (1) the address of the memory location to be written to, and (2) the data to be written to the location. Commands that either read to or write from the simulated main memory of a computer are examples of normal functions.

A "control function" is defined as all functions other than "normal functions". For example, commands may be passed to the simulator to tell it how to set up various buffers, or how to communicate with a terminal connected to the computer running the simulator. These commands are directed to the simulator itself, and are not intended to be passed on to the simulated integrated circuit as one of the commands in its command set.

A "test settings file" is defined as a file having parameters or other descriptions of how a test is to be generated. It is used to guide another program in creating a sequence of functions or tests for testing an integrated circuit device. It need not be in any particular data format.

A "test source file" or "test file" is defined as a file containing a sequence of functions or tests to be applied by a simulator to a simulated integrated circuit. It is typically in plaintext for human review and may be (although need not be) compiled into a more compact form for execution by a simulator. A "set address" refers to a specific portion of any memory address given to a cache by a processor.

The "set address" portion of a memory address is the portion that the cache uses to determine the particular set of cache locations that might contain the desired block of data. The length of the "set address" portion will vary depending upon the size of the cache.

A "tag address" is a sub-address used by the cache to identify particular cache memory locations within a particular set of memory blocks in the cache memory.

"Commodity I/O" refers to data input and output between the processor and devices other than main memory. Commodity I/O may include, for example, communications between the processor and special subsystems such as user input devices (e.g. keyboards and mice), data acquisition devices, data card readers and video display adapters. Commodity I/O read commands have different opcodes from regular (or "normal") memory read commands. Most caches are configured to identify these different command codes and process Commodity I/O reads and writes differently than normal read and write commands. In particular, many caches do not cache Commodity I/O data. When they receive a Commodity I/O read command they fetch the data from the Commodity I/O device and provide it to the processor without caching a copy of the fetched data or prefetching adjacent data from the Commodity I/O device. When they receive a Commodity I/O write command, they merely write the data to the identified address and do not keep a copy in cache memory for later reference and use. In sum, cache devices typically suspend their caching capabilities when reading or writing to Commodity I/O addresses.

"Bit-wise writes" or "per-J writes" refer to processor write functions that write directly to sub-portions or "bits" of words rather than to entire words. Bit-wise writes therefore change the contents of portions of a memory location word, but not the entire word itself.

"Leaky writes" refer to processor write functions that force the cache to write data to main memory sooner than it would under other circumstances. In the preferred embodiment, a "leaky write" is a processor write function that has a special control bit that can be set. This control bit indicates to the cache that the data in the write function should be written out sooner than the cache would if it used its normal data aging process. As a result, by issuing a leaky write command, the processor is configured to avoid the cache's normal data aging processes and write data to main memory as soon as reasonably possible.

A "prefetch write" is a command that a processor sends to its associated cache device. This command directs the cache to assert "ownership" of the memory location in the prefetch write command. A processor makes prefetch write commands in advance of the processor writing data to that main memory location to insure that the memory location will be available for writing to when the processor later wishes to actually write to that location. The cache asserts ownership of the memory location by toggling a protocol bit associated with that memory location. The idea of "owning" a memory location arises from the MESI protocol employed by many multiprocessor computers, a protocol by which several processors and their associated caches can cooperatively share access to common memory locations. Once the processor has asserted its ownership of a memory location with a prefetch write command, thereby preventing other processors from accessing the location, it can then write to that location without having to wait for another processor to release its prior ownership. Once the processor actually writes to that location (or rather, commands the cache to write to that location) with a subsequent write command, the ownership protocol bit of that memory location is automatically toggled, releasing ownership of the memory location and permitting other processors to access that memory location A processor can release a memory location it has prefetch written previously by writing data to that memory location. The process of returning to memory locations that were prefetch written to earlier and releasing them is defined as "closing prefetch loops".

A "read with lock" function simultaneously reads a main memory location and establishes ownership of that location (and the adjacent locations comprising the 8-16 word cache line fetched by the read-with-lock function) using the MESI protocol. In the example provided herein, this memory lock is released by (1) accessing (either by reading from or writing to) any of the 8-16 words of the cache line fetched by the read-with-lock function, and (2) subsequently issuing a lock release function to the specific memory location previously locked. When the processor sends the lock release function to the cache, it commands the cache to toggle the MESI protocol bit originally toggled to lock the location.

A computer has an "overlapped" memory space when instructions and operands are interspersed in its main memory. A computer does not have an overlapped memory space when its main memory includes at least two separate ranges of memory locations, one range for storing instructions and one range for storing operands. In a computer configured with an overlapped memory space, a cache memory can be asked by a processor to read an instruction from a memory location, read an operand from the same location, and later write an operand to the same location. In a computer that is not configured with overlapped memory, the processor can instruct the cache to perform read instructions only from addresses in that portion of main memory that stores instructions. Similarly, the processor in a non-overlapped computer can only direct the cache to read operands from or write operands to memory locations that are in the range of memory locations reserved for operands. There are therefore at least two ranges of addresses in a non-overlapped computer: one range of addresses identifying instruction memory locations and another range of addresses identifying operand memory locations. In an overlapped memory computer, there are no such separate sets of memory locations.

The discussion below describes several different random and weighted random selections made by the FGP. All these selections are preferably made using the common Mitchell-Moore random number generation algorithm. One embodiment of this algorithm can be found in Volume 2 of "The Art of Computer Programming", published by Addison-Wesley.

Overview

The objective of design verification is to ensure that errors are absent from a design. Deep sub-micron integrated circuit (IC) manufacturing technology enables IC designers to put millions of transistors on a single IC. IC design complexity tends to double the number of circuits fabricated on an IC in ever-shortening time intervals, which causes design verification complexity to increase at an exponential rate. In addition, competitive pressures are putting increased demands on reducing time to market. The combination of these forces has caused an ever worsening "verification crisis".

Today's design flow starts with a specification for the design. The designer(s) then implements the design in a language model, typically a hardware description language such as VHDL or Verilog. This model is typically verified to discover incorrect input/output (I/O) behavior via a stimulus in expected results out paradigm at the top level of the design.

To do this verification, the computer simulator, whether hardware or software, is provided with a sequence of normal functions, representing commands of the command set of the device's normal functions, together with control functions. These normal functions and control functions are typically created and stored in a plaintext file called "test source files" or "test files". The test source files include a series of functions typically written in a higher level language, such as C++, for example, and have from a few hundred to a few thousand of these functions.

Manually creating and debugging test source files would be an extremely time consuming process. For this reason another class of programs have been created to automatically generate test source files.

These automatic function generating programs, called "FGP", are capable of generating a variety of different functions depending upon the type of instructions or parameters they are given. The instructions or parameters are typically provided in a plain text file called a "test settings file". Once the FGP is invoked, it reads the parameters from the test settings file and generates the functions used by the simulator to test the design. As they are created, the FGP writes the functions sequentially to the test source file and stops.

A human author creates the test settings file by deciding what the purpose of the test shall be and parameterizing the test. The author enters the test parameters into the test settings file, and calls the FGP to generate the test source file based on the test settings file.

Computer Arrangement

Figure 1:
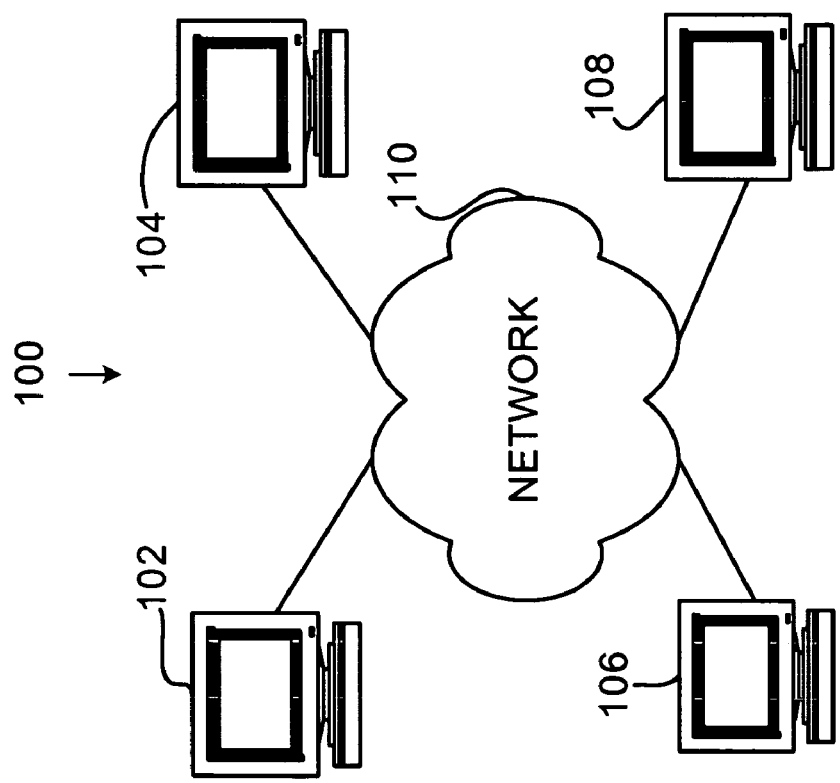
FIG. 1 illustrates a computer network having several nodes, the nodes including a workstation for generating tests in accordance with the present invention, a software simulator for simulating the operation of an integrated circuit, a hardware simulator for simulating the same integrated circuit, and a server for backing up the various operating programs and data files of the computers at the other nodes.

FIG. 1 illustrates a functional verification system 100. System 100 is preferably comprised of several computers 102, 104, 106, and 108 that are coupled together over a corporate network 110. While system 100 is preferably distributes in this manner, it may be implemented on one or more computers having the capabilities described below.

Computer 102 is a test development workstation configured to generate test programs for testing an integrated circuit design using a novel test generation program. It is preferably a general purpose computer running a general purpose operating system such as Microsoft Windows.

Computer 104 is a computer configured to simulate the integrated circuit design that is being tested by running an integrated circuit design simulation program. It is preferably a Solaris workstation available from Sun Microsystems. The design program is preferably the Cadence Design NC-SIM software simulation program, configured to simulate the cache memory circuit design in software, and available from Cadence Design Services, Inc.

Computer 106 is a computer configured to simulate (in hardware) the cache memory circuit design that is being tested. It is preferably a CoBalt simulator, hardware simulator available from Cadence Design Services, dba Quickturn Design Systems.

Computer 108 is a backup computer configured to archive data and programs that are on the test development workstation.

Network 110 couples each of computers 102, 104, 106, and 108. It is illustrated as a network cloud and may include modems, routers, hubs and gateways (not shown) to couple the computers. It may be configured to include a LAN or a WAN. It may also include a public packet switched network, such as the Internet, for example.

Figure 2:
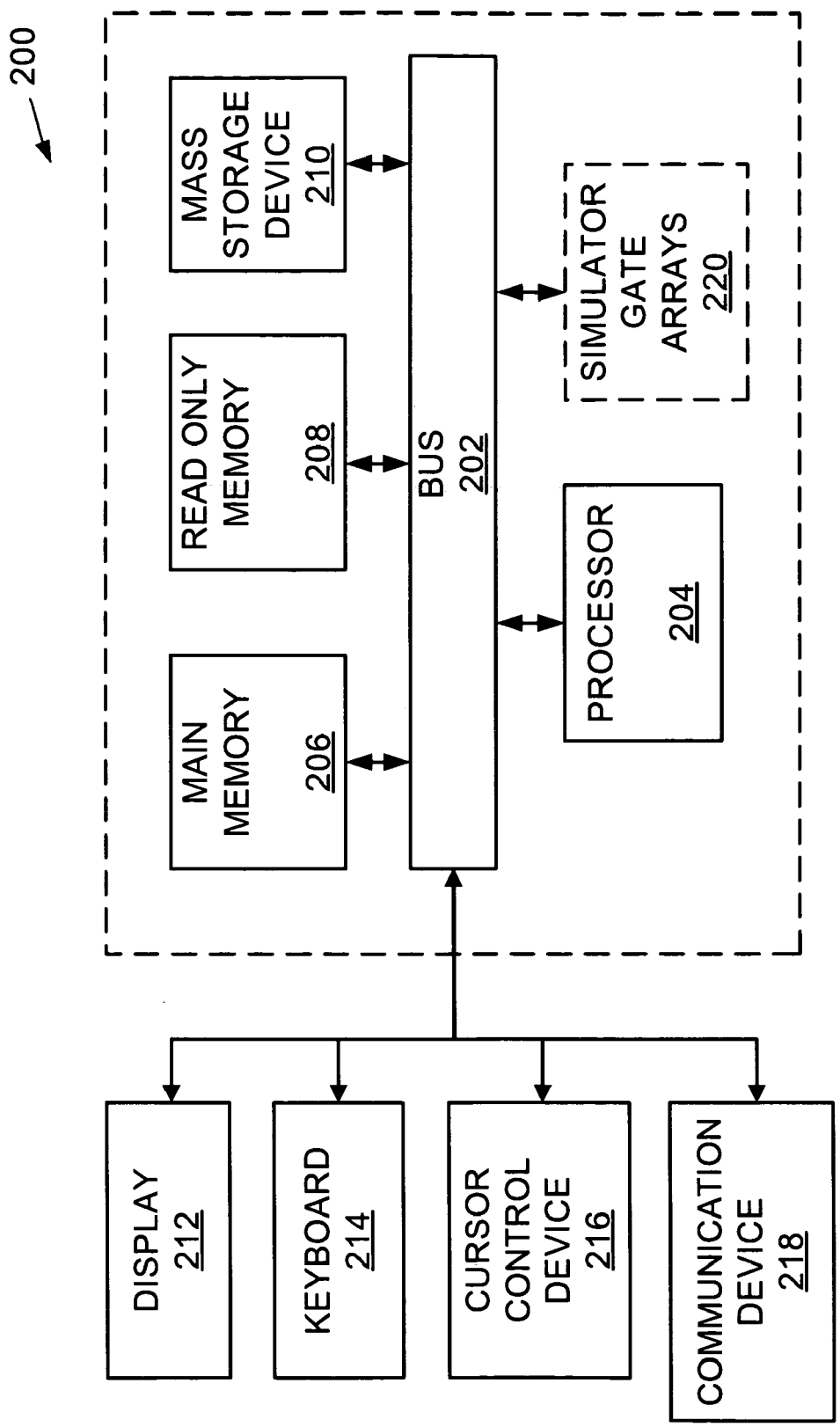
FIG. 2 illustrates the detailed construction of the workstation, the software simulator, the hardware simulator, and the server for backing up files.

FIG. 2 illustrates architectural details of a preferred computer 200 that may be used for any of computers 102, 104, 106, and 108 of FIG. 1.

Computer system 200 comprises a bus or other communication means 202 for communicating information, and a processing means, such as processor 204, coupled with bus 202 for processing information. Computer system 200 further comprises a random access memory (RAM) or other dynamic storage device 206 (referred to as main memory), coupled to bus 202 for storing information and instructions to be executed by processor 204. Main memory 206 also may be used for storing temporary variables or other intermediate information during execution of instructions by processor 204. Computer system 200 also comprises a read only memory (ROM) and/or other static storage device 208 coupled to bus 202 for storing static information and instructions for processor 204.

A mass storage device 210, such as a magnetic disk or optical disk and corresponding drives, may also be coupled to computer system 200 for storing information and instructions. Computer system 200 can also be coupled via bus 202 to a display device 212, such as a cathode ray tube (CRT) or Liquid Crystal Display (LCD), for displaying information to an end user. For example, graphical and/or textual depictions/indications of design errors, and other data types and information may be presented to the end user on the display device 212. Typically, an alphanumeric input device 214, including alphanumeric and other keys, may be coupled to bus 202 for communicating information and/or command selections to processor 204. Another type of user input device is cursor control 216, such as a mouse, a trackball, or cursor direction keys for communicating direction information and command selections to processor 204 and for controlling cursor movement on display 212.

A communication device 218 is also coupled to bus 202. Depending upon the particular design environment implementation, the communication device 218 may include a modem, a network interface card, or other well-known interface devices (not shown), such as those used for coupling to Ethernet, token ring, or other types of physical attachment for purposes of providing a communication link to support a local or wide area network, for example. In any event, in this manner, the computer system 200 may be coupled to a number of clients and/or servers via a conventional network infrastructure, such as a company's Intranet and/or the Internet, for example.

When used as hardware simulation computer 106, a computer like computer 200 also includes simulator programmable gate arrays 220 that are programmed by processor 204 to simulate the integrated circuit design.

Overall Verification Process

Figure 3:
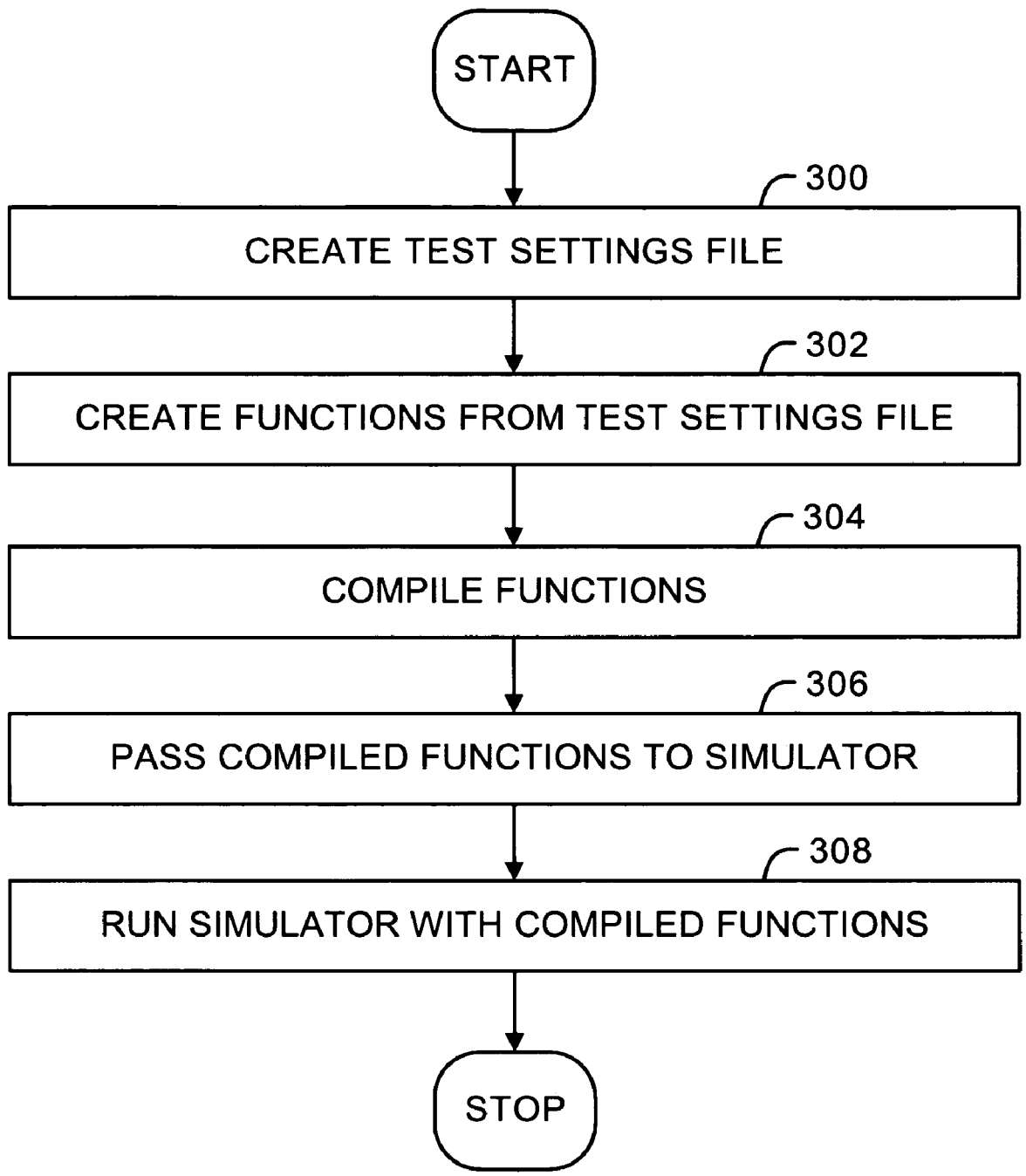
FIG. 3 is a flow chart illustrating the overall operation of the computer network of FIG. 1 in creating a test file and using that file in the software simulator and the hardware simulator, for testing a cache memory circuit design.

FIG. 3 illustrates the overall process of creating and running a functional verification test on the system of FIG. 1.

In step 300 as described above, the operator creates a test settings file that includes the desired range of tests that are to be performed by the simulator. The tests can include what are known as "hang-detect" and "error-detect" tests as well as data verification tests. Hang-detect tests do not verify data, but rigorously exercise the integrated circuit design to see whether and under what conditions the device ceases to function. Error-detect tests similarly exercise the design to see whether and under what conditions the design will generate an error signal. Error signals are designed to be generated by an integrated circuit device (such as the cache memory described herein) whenever the operator attempts to perform an illegal operation, such as dividing a non-zero number by zero, for example.

In step 302, the operator invokes the FGP on computer 102 and passes it the name of the test settings file. On receiving the name of the test settings file, the FGP opens it, parses it and reads its contents into memory. The FGP processes the test settings file, creates a list of test functions in an output buffer and writes those functions to the test source file. This process is discussed in more detail below with regard to FIG. 5A through FIG. 5E.

In step 304, the operator invokes a program called a port driver compiler ("PDC") on computer 102 and passes it the name of the test source file. The PDC opens the test source file and compiles the test source file into what is called a "test file". This file is also a plain text file that represents the functions in a different format, a format that is accessible to the simulator.

In step 306, the operator invokes either the software simulator on computer 104 or the hardware simulator on computer 108 and passes it the name of the test file.

In step 308, the simulator to whom the test file was passed then simulates the cache memory integrated circuit design being tested and applies each of the functions in turn as they are described in the test source file.

The process above starts with the test settings file, which describes the general nature of the test to be performed. It holds the basic information about the nature of the test to be generated.

Test Settings File

The test settings file 400 has a specific format that enables it to be read by the FGP. This file structure is shown in FIG. 4.

Field 1 402 of test settings file 400 lists the number of port drivers ("PD") in the test. A port driver is electronic circuitry that includes a module of hardware logic which acts as a simplified stand-in version of the hardware with which the hardware-under-test interacts.

Field 2 404 of test settings file 400 is an integer value indicating the total number of requests that will be processed by all the PD's. This number is not necessarily evenly distributed between all the PD's. One PD could dominate the test by receiving most (or all) of the port requests, for example.

Field 3 406 of test settings file 400 is a Boolean value (i.e. a "0" or a "1") that directs the FGP to provide data verification (if "1") or not (if "0"). If data verification is not provided (or turned "on") the FGP will not create a data integrity buffer and will not verify data. The FGP provides data verification by creating a series of data integrity check functions, discussed in more detail below (see block 576). The FGP does not create integrity check functions if Field 3 is set to "0".

Field 4 408 of test settings file 400 is a Boolean value that dictates whether the instruction cache of the cache memory design being tested and the operand cache of the cache memory design being tested may be overlapped or not.

Field 5 410 of test settings file 400 is a comma-separated list of integers that defines the number of times each PD loops through the test. These integers do not have to be equal for each PD. There is also no need for the number of loops to sum to the total number of requests. If no loop count is indicated, the FGP assumes a value of "0" for each PD. A value of zero means that the list of functions shall not include any control functions to loop through normal functions for any PD.

Field 6 412 of test settings file 400 is a comma-separated list of integers of indeterminate length that the FGP randomly selects between in block 532 (FIG. 5C) to use as "set address" values for both instruction and operand functions (other than Commodity I/O functions) when the operator indicates in Field 4 408 that the instruction cache and the operand cache are overlapped.

Field 7 414 of test settings file 400 is a comma-separated list of integers of indeterminate length that the FGP randomly selects between in block 532 (FIG. 5C) to use as "tag address" values for both instruction and operand functions (other than Commodity I/O functions) when the operator indicates in Field 4 408 that the instruction cache and the operand cache are overlapped.

Field 8 416 of test settings file 400 is a comma-separated list of integers of indeterminate length that the FGP randomly selects between in block 536 (FIG. 5C) to use as "set address" values for operand cache functions (other than Commodity I/O functions) when the operator indicates in Field 4 408 that the instruction cache and the operand cache are not overlapped.

Field 9 418 of test settings file 400 is a comma-separated list of integers of indeterminate length that the FGP randomly selects between in block 536 (FIG. 5C) to use as "tag address" values for operand cache functions (other than Commodity I/O functions) when the operator indicates in Field 4 408 that the instruction cache and the operand cache are not overlapped.

Field 10 420 of test settings file 400 is a comma-separated list of integers of indeterminate length that the FGP randomly selects between in block 540 (FIG. 5C) to use as "set address" values for instruction cache functions when the operator indicates in Field 4 408 that the instruction cache and the operand cache are not overlapped.

Field 11 422 of test settings file 400 is a comma-separated list of integers of indeterminate length that the FGP randomly selects between in block 540 (FIG. 5C) to use as "tag address" values for instruction cache functions when the operator indicates in Field 4 408 that the instruction cache and the operand cache are not overlapped.

Field 12 424 of test settings file 400 is a comma-separated list of integers of indeterminate length that the FGP randomly selects between in block 528 (FIG. 5B) to use as "set address" values for Commodity I/O operations.

Field 13 426 of test settings file 400 is a comma-separated list of integers of indeterminate length that the FGP randomly selects between in block 528 (FIG. 5B) to use as "tag address" values for Commodity I/O operations.

Field 14 428 of test settings file 400 is a comma-separated list of twelve integers. Each of these integers corresponds to a relative weight associated with one of twelve different categories of functions that the FGP may generate and write to the test source file. The twelve different categories of functions that the FGP is programmed to generate include: (1) dayclock operations, e.g. those that read and write to the system clock, (2) lock operations, e.g. those that lock memory locations to prevent access by other processors, (3) instruction cache reads, which read instructions from the main memory, (4) operand cache reads, which read memory locations in the main memory that contain data, (5) Commodity I/O operations, which read or write to memory locations in devices not a part of the main memory, (6) fast writes, which are a group of commands that write at greater speed, (7) per-J (or "bitwise" writes), (8) 8-word block writes, e.g. those commands that write to a block of eight words at once, (9) all other block writes, (10) background operations, (11) UPI message functions, e.g. processor interrupt messages, and (12) add zero operations. The functions in these categories can and are mixed and matched in any combination (with the exception of the add zero operations) by the FGP when it randomly generates functions. As with the random addresses, it does this using the Mitchell Moore Additive generation algorithm for generating random numbers. By using the Mitchell Moore algorithm, less patterned random numbers can be created. Alternative random number generation algorithms can also be used.

The first eleven of the twelve integer weights in Field 14 indicate to the FGP the different relative frequencies of occurrence of each of the first eleven categories of functions. These weights direct the FGP to generate functions from these categories in relative numbers equal to their relative weights.

If a first category of functions has an associated integer weight in Field 14 that is twice as large as the integer weight of a second category of functions, the FGP is programmed (in block 524, FIG. 5B) to randomly generate functions from the first category of functions twice as often as it randomly generates functions from the second category of functions. Similarly, if a third category of functions has an associated integer weight in Field 14 that is five times as large as the integer weight of the second category of functions, the FGP is programmed (in block 524, FIG. 5B) to randomly generate functions from the third category of functions five times as often as it randomly generates functions from the second category of functions. Computer algorithms for making such weighted random selections are known in the art.

Thus, the operator generates eleven weights indicating the relative rates of occurrence of each of the first eleven categories of functions The twelfth value in Field 14 corresponds to the "add zero" sequence of operations. The "add zero" (or "ADD_0") sequence of operations, when executed by the simulated processor, (1) commands the cache to read a memory location, (2) adds a zero to the retrieved contents of the memory location, then (3) commands the cache to write the now-changed contents back to the original memory location. When the simulated processor adds zero to the contents of the memory location and sends the contents back to the cache to be stored in the original memory location, it signals the cache that the value has been changed, even though it has not really been changed. Since the data has been changed, the cache rapidly writes the changed data back to the original memory location. In this manner, the add zero sequence of operations force the cache to effectively read from a random memory location and immediately write the same data back to the same memory location.

When the twelfth value in Field 14 is non-zero or "set", the FGP is configured to ignore the other eleven function categories and weights in the first eleven values of Field 14. A non-zero twelfth value causes the FGP to generate only "add zero" sequences each time it executes block 524.

Hence, when the twelfth value is non-zero the FGP generates only one category of function: the add zero function, instead of generating the eleven categories of functions at random each time block 524 is executed.

Function Generator Program

FIG. 5A-FIG. 5E illustrate in flowchart form the operation of the FGP, which is illustrated in FIG. 3 as block 302. The steps illustrated in FIG. 5A-FIG. 5E show how the FGP opens the test settings file, reads the data, creates the control functions, normal functions and data integrity buffer, how it generates the tests, and finally, how it writes the functions to the test source file.

Figure 5A:
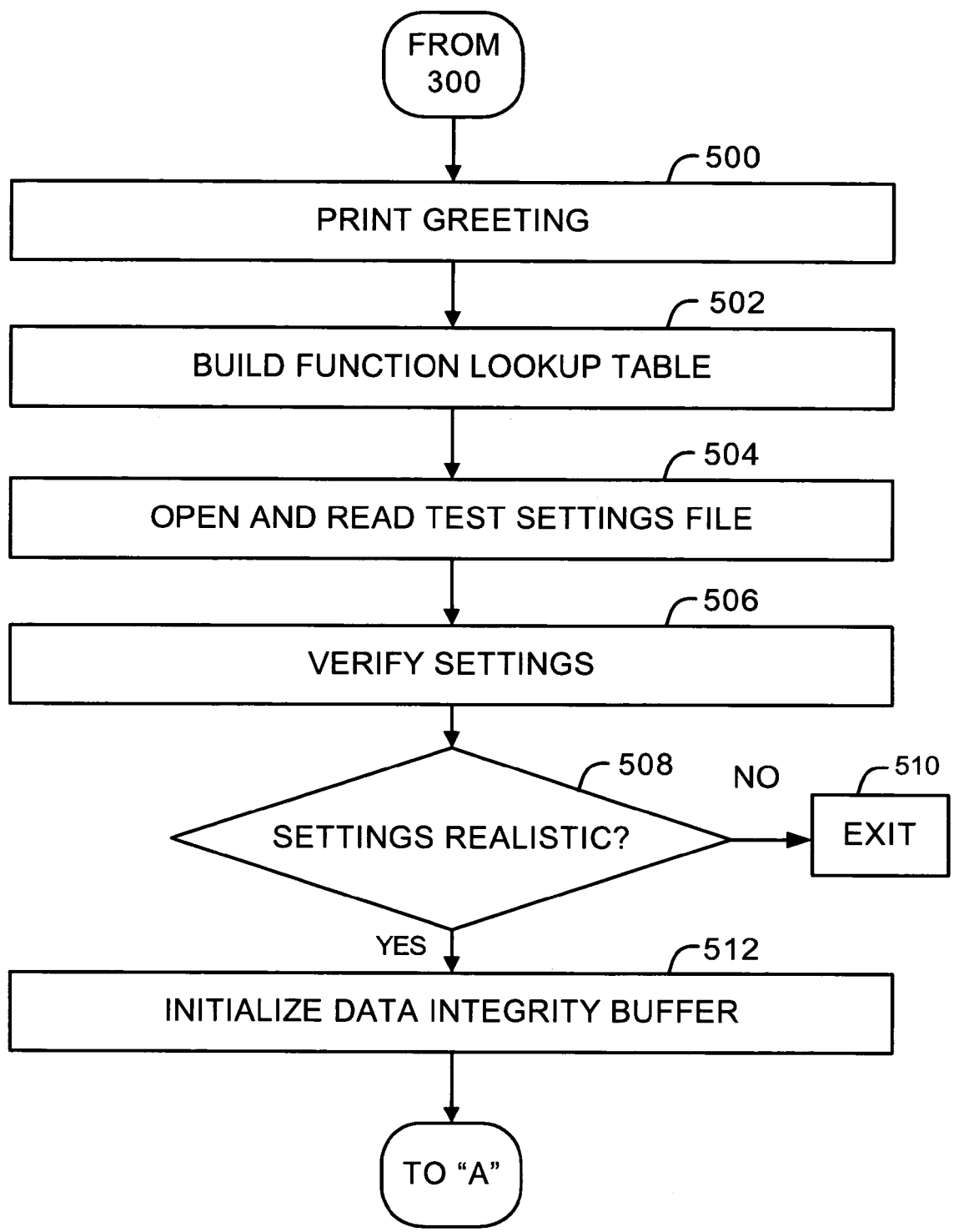
FIG. 5A-FIG. 5E illustrate flow charts detailing the process of creating functions from the test settings file using function generating programs (FGP).

Referring now to FIG. 5A, when the operator invokes the FGP and passes it the name of the test settings file, the FGP first prints an informative greeting (block 500) displaying version and contact information. After this, the FGP builds a function lookup table (block 502), which holds information about every normal function that may be invoked by the FGP and passed by it to the simulator. This lookup table simplifies and speeds up the operation of the FGP.

In block 504 the FGP opens the test settings file and reads its values into an internal data structure, an input buffer, of the FGP. Once the entire contents of the test settings file has been read into the FGP, the FGP closes the test settings file.

The author of the test settings file may have made errors in creating the file. For this reason the FGP checks the test parameters stored in the fields of the test settings file to determine whether they are proper (block 506) and within reasonable limits (block 508). If they are not, then the FGP program halts and exits (block 510). Improper parameters include such things as (1) tag and set addresses in the test settings file that are completely out of range and therefore impossible, (2) missing fields in the test settings file that make it impossible to determine relative weights of the functions to be generated, and (3) negative values provided as relative weights for functions. Limits that may be exceeded and cause the FGP to halt include such things as the total number of functions to be generated. If the number of generated functions is too high, either the FGP or the simulator or both may run too long.

If the settings are realistic and proper, the program continues to block 512 which sets up the data integrity buffer. The data integrity buffer is an internal data structure created by the FGP to simulate the way data is written to memory locations in the cache memory circuit that is being simulated. This buffer is different than the memory locations that are simulated by the simulator when it executes, and is used only while the FGP runs.

To understand the operation of the data integrity buffer we will first consider the operation of the system as a whole. The FGP creates test functions that are commands to a cache to perform certain operations. The FGP creates a sequence of these functions and stores them in a test file. The simulator receives the test file. It reads the functions one-by-one and commands the simulated cache memory to perform these operations. The simulated cache, in turn, receives each command and responds accordingly by doing what the command tells it.

For each of the test functions it creates, the FGP is programmed to know what the corresponding cache memory changes should be, what they will be, if the cache is operating properly. Each time the FGP creates a test function for the test file, it anticipates what change the cache should make to cache memory based on that function and makes a record of that change. The data structure in which the FGP makes that change is called the data integrity buffer. The data integrity buffer therefore indicates the contents of the cache memory buffer (1) as it will be when the cache is later simulated using the test file created by the FGP, and (2) if the cache operates properly. Any difference between (1) the contents of the cache memory after the FGP test functions have been executed by the simulator and (2) the data in the data integrity buffer, indicate a flaw or problem in the cache design.

For this reason, the last functions that the FGP writes to the test file are integrity check functions. These functions tell the simulator to read the cache memory contents and compare them with the contents of the data integrity buffer (see block 576). It is the simulator which invokes these integrity check functions that determines whether the cache has performed its memory manipulations properly.

Figure 5B:
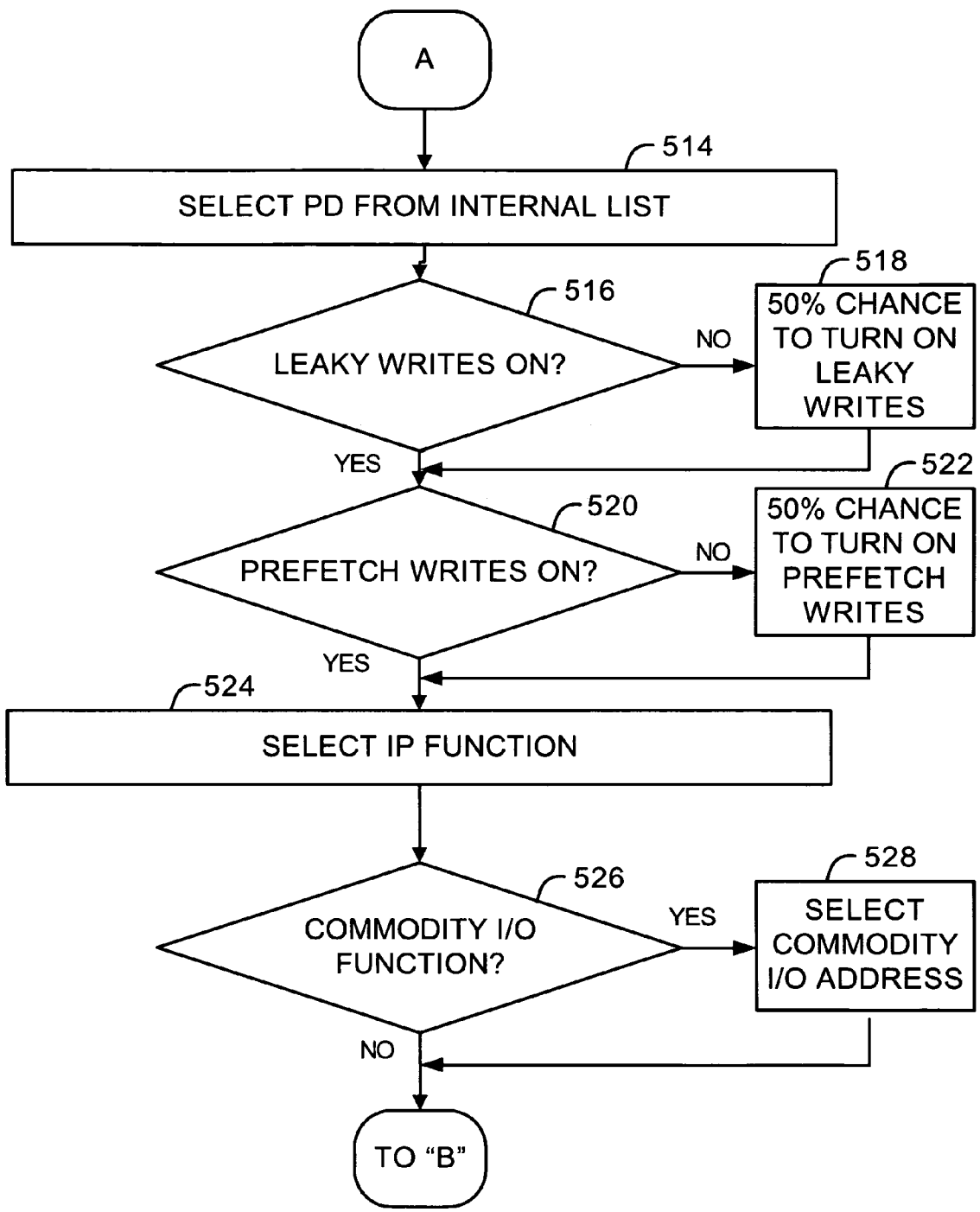
Figure 5C:
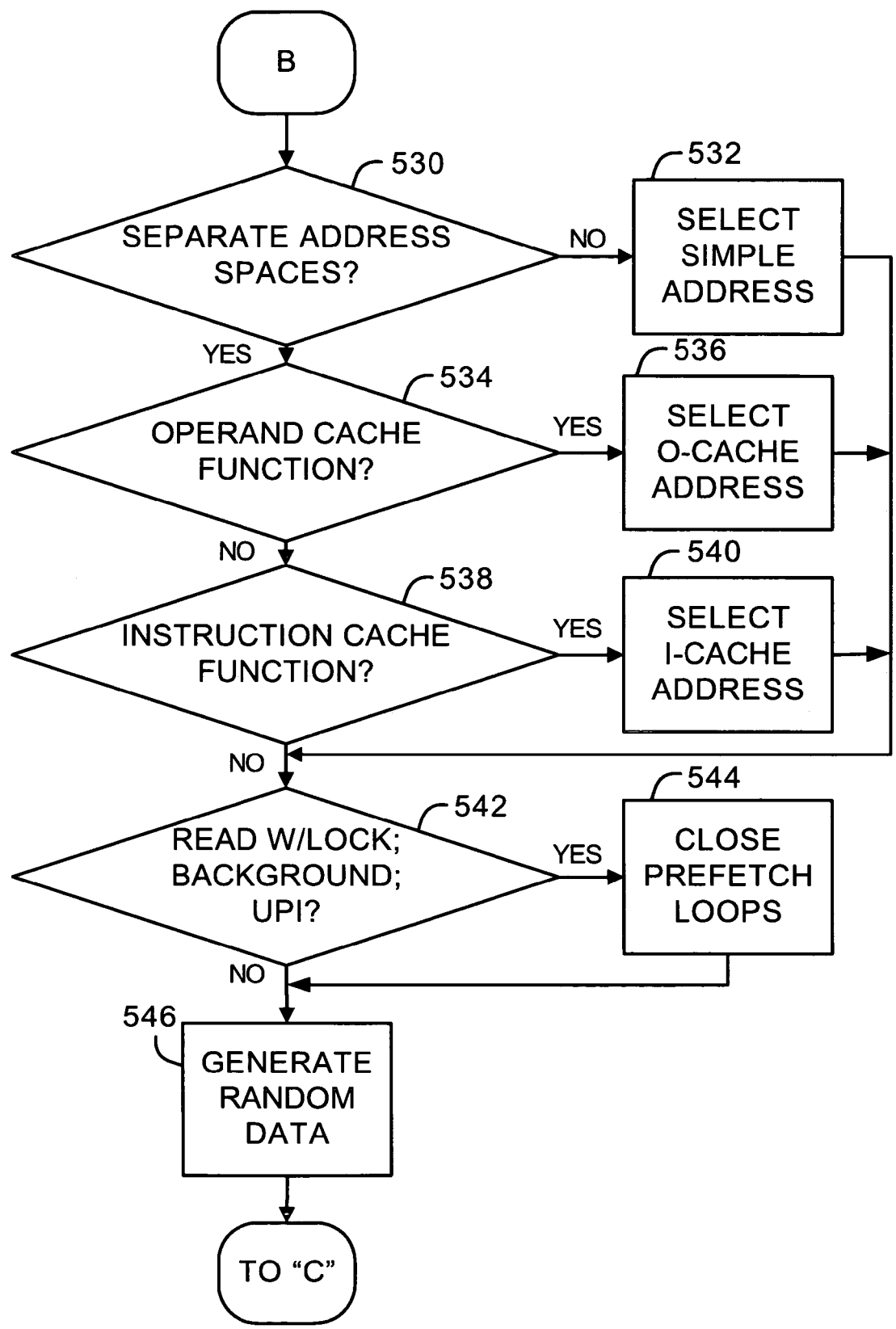
Figure 5D:
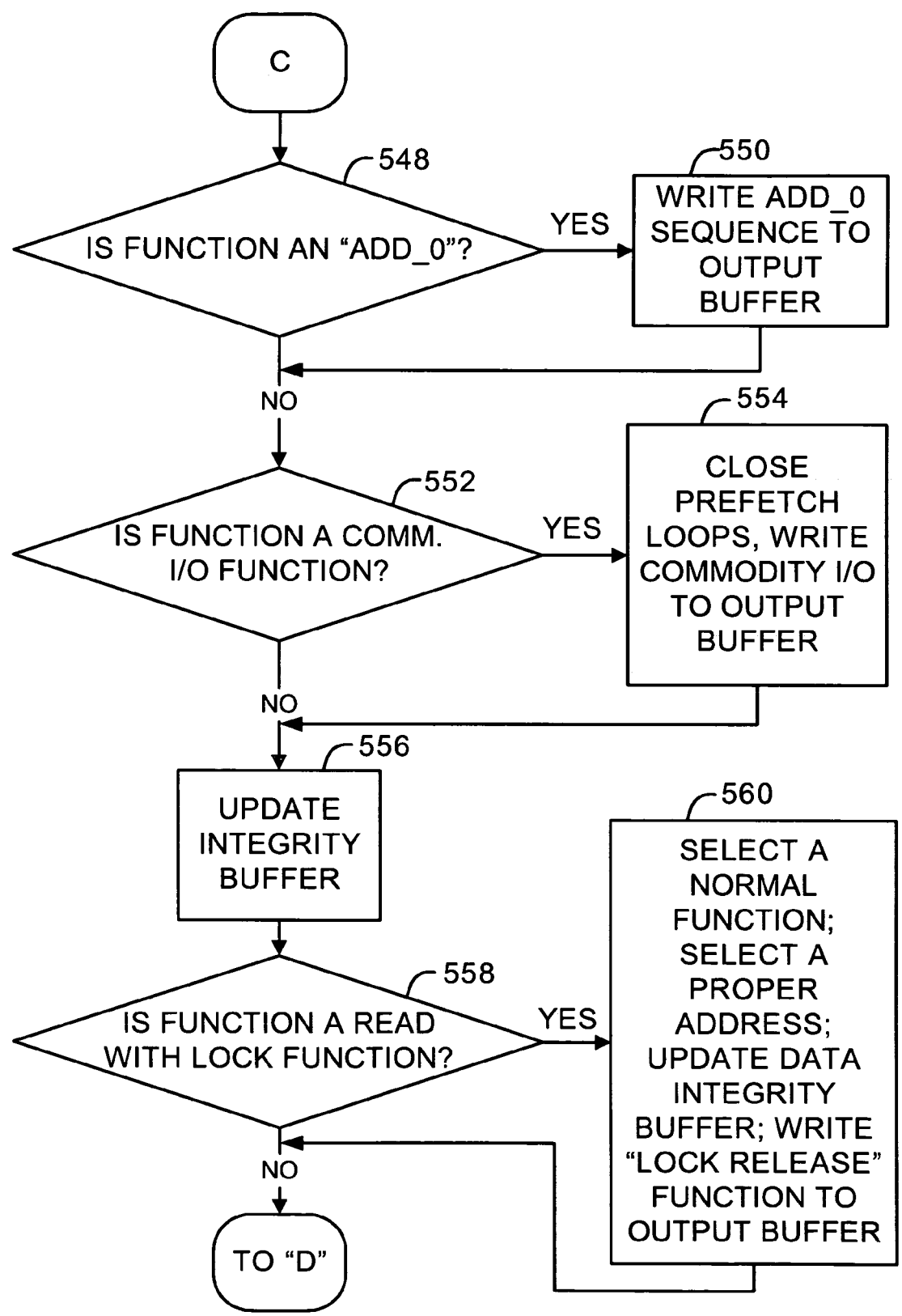
Figure 5E:
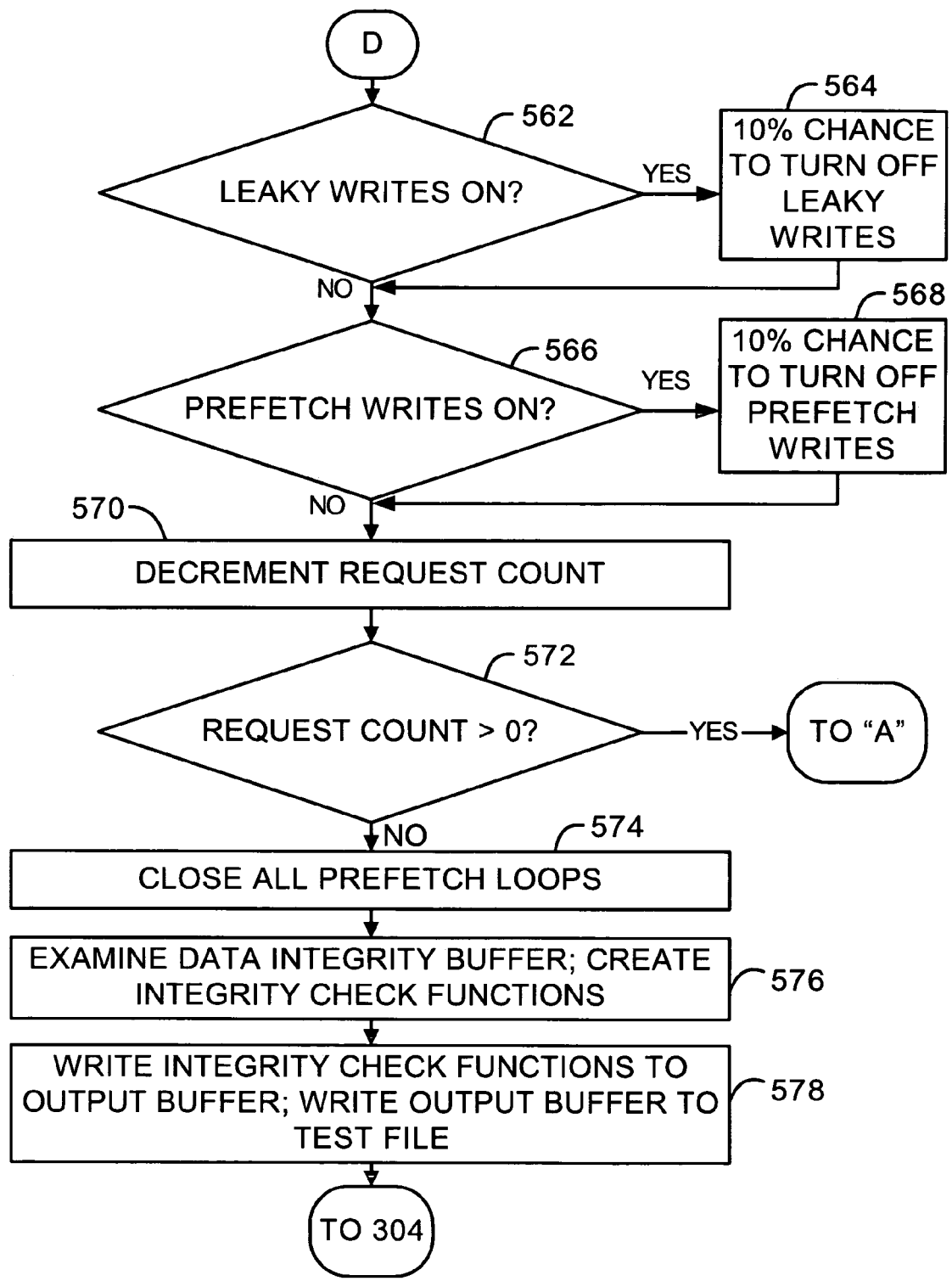

The block identified as "A" at the top of FIG. 5B identifies the beginning of a large loop in which the FGP creates the functions. Each time a function is created, the FGP loops through the steps identified in FIG. 5B-FIG. 5E.

At block 514, the first step in the loop, the FGP randomly selects a PD (port driver) from the available PD's. The number of PD's available to be selected between is provided by Field 1 402 of the test settings file.

In block 516, the FGP checks to see if leaky writes to the cache are on. If they are not, the FGP makes a random selection for leaky writes with a 50% probability (block 518). If leaky writes are already selected, they remain selected. To balance this net bias in favor of leaky writes, block 564 (FIG. 5E) randomly turns leaky writes off about one time for every ten times block 564 is executed (i.e. ten percent of the times block 564 is executed), thus providing a balance in favor of leaky writes.

In block 520, the FGP checks to see if prefetch writes are on. If they are not, the FGP makes a random selection in favor of prefetch writes with a fifty percent probability (block 522). If prefetch writes are already selected, they remain selected. To balance this net bias in favor of prefetch writes, block 568 (FIG. 5E) randomly turns prefetch writes off about one time for every ten times block 568 is executed (i.e. ten percent of the times block 568 is executed), thus providing a balance in favor of prefetch writes.

In block 524 the FGP selects between the twelve available functions in the function list for the function it will construct. The FGP weights these functions in accordance with the weights that the operator previously generated and stored in Field 14 428 of the test settings file (see FIG. 4, above) and makes random selections among these weighted functions. "Random" does not mean equally weighted, since in practice some functions will be selected more often that others per the operator's weightings of the test settings file.

In block 526, the FGP checks to see if the function it elected in block 524 is a Commodity I/O function. If it is, then the FGP randomly selects a Commodity I/O Address (block 528) to be used with that function.

In block 530 (FIG. 5C) the FGP checks to see if the operator selected separate operand and instruction addresses for the operand and the instruction caches in Field 4 408 of the test settings file. If they are not in separate address spaces (i.e. they are overlapped per Field 4 408), then the FGP continues to block 532 and selects an address from Field 6 412 and Field 7 414 for that function. Once the address has been selected, the function is complete and processing skips to block 542.

If the FGP determined in block 530 that the operator did not select separate I/O spaces, then processing continues with block 534, in which the FGP checks to see if the function is an operand cache function. If so, the FGP continues to block 536 and selects an operand cache address. The FGP then continues to block 542 as in the previous case.

If, on the other hand, the function is not an operand cache function, the FGP continues to block 538 to check if it is an instruction cache function. If it is an instruction cache function, the FGP continues to block 540 in which it selects an instruction cache address for use with that function. The FGP then continues to block 542 as in the previous two cases.

The FGP continues processing at block 542 in which it determines whether the selected function is a lock operation (such as a read-with-lock function), a background function (such as a page_zero write), or a UPI message function. If it is any of these functions, any open prefetch loops must be closed before the function is called or the cache memory will generate an error (block 544). Prefetch loops are a set of control functions that cause the port driver of the simulator to iterate through a given set of normal functions multiple times to simulate a behavior in the simulated cache memory called prefetch writes. The FGP closes the prefetch loop by toggling the prefetch mode off and performing non-prefetch (or standard) writes to each of the memory locations that were previously written to in prefetch mode.

In block 546 the FGP generates random data for the function just selected as well as completing the random address creation. If the function that the FGP selected is a write command, for example, the random data includes the data that the function writes In block 548, the FGP determines whether or not the function is an ADD_0 function, and if so, it writes to the output buffer (block 550) all composite activities that constitute the ADD_0 function. These activities are collectively called the ADD_0 sequence.

In block 552, the FGP determines whether the function it randomly selected is a Commodity I/O function. If so, it closes any open prefetch loops and writes the Commodity I/O function to the output buffer (block 554).

At this point, the FGP has determined all the contingencies of the control functions it is constructing. Among other things, for all write functions the FGP has selected both the cache memory address to be written to (which can include bit-wise writes) and the data that is to be written to that address. The FGP formats the data and writes the function to the output buffer.

Having written the function to the output buffer, the FGP then updates the data integrity buffer in block 556. The data integrity buffer can be thought of as a collection of cache memory addresses associated with the data they hold. To build the data integrity buffer, the FGP examines the function it has just assembled and written to the output buffer. It identifies the memory addresses of the function and the data that are stored there. It makes an entry in the buffer for this memory location, recording both the location and the data stored there.

On subsequent passes through block 556, the FGP examines the data integrity buffer to determine whether or not the cache memory address parameter of the current function already exists in the data integrity buffer. If the address exists in the data integrity buffer, it means that sometime in the past the FGP created a function that wrote to that memory location. Whenever the FGP finds a pre-existing entry for the identical cache memory location in the data integrity buffer in block 556, it removes the old data associated with that location from the buffer and replaces it with the new data stored in that location.

The FGP shadows the cache memory write operations of the FGP, maintaining in the data integrity buffer the very latest contents of each of cache memory locations. Whenever a new function writes to a location, the FGP either adds that new location to the data integrity buffer, or (if the location already exists in the data integrity buffer) it replaces the existing contents of that location with the latest contents written to that location.

In this manner, the data integrity buffer always includes the freshest data written to cache memory locations. The data integrity buffer provides a snapshot of what the current cache memory contents (by address and corresponding value) should be at any time.

It should be recognized that the FGP does not actually write to or update a cache memory location. It merely creates functions that are used by the simulator to write to the cache memory location maintained by the simulator. The data integrity buffer is likewise not a part of the simulator, but a separate buffer created by the FGP whenever it runs, and closed by the FGP when the FGP stops running and the FGP's output file, the test source file, is complete.

Once the FGP has written to the data integrity buffer, the FGP then checks to see if the function it just wrote to the output buffer was a read-with-lock function (block 558). If it was, then the FGP continues to release that lock by at least one main memory accessing function must be written to the output buffer and be followed with a lock release function. The purpose of this activity is to make sure there is at least one main memory accessing function (e.g. a command that requires no special handling, such as a read with lock, background function or a Commodity I/O function) before releasing the lock (block 560). When the FGP releases the lock, the FGP writes a lock release function to the output buffer, which (if required in block 558) completes the creation of the function.

The FGP then proceeds to block 562 in which it checks to see if leaky writes are selected. If they are, then the FGP randomly chooses (block 564) whether or not to keep them on. The FGP automatically weights this choice such that about ten percent of the time it will turn off leaky writes and about ninety percent of the time it will leave leaky writes turned on. Of course other probabilities can be selected.

The FGP then proceeds to block 566 in which it checks to see if prefetch writes are selected or "on". If they are, then the FGP randomly chooses (block 568) whether or not to keep them on. The FGP automatically weights this choice such that ten percent of the time it will turn off prefetch writes and ninety percent of the time it will leave prefetch writes turned on.

At this point the FGP has written the test function to output buffer in memory and has shadowed to the data integrity buffer all of the functions that would change the contents of the cache memory. The FGP is almost ready to create another function, but must first determine whether an additional function is proper or whether the FGP should quit.

Each time the FGP executes block 570, it decrements the PD request counter, which it has already read from Field 4 408 of the test settings file. This integer value indicates the number of times the FGP loops through its instructions to create a new test function.

Once it has decremented the PD request counter, FGP then checks to see if the counter has reached zero (block 572). If it has not reached zero, then the FGP branches back to the beginning of the function writing loop at the top of FIG. 5B and starts creating another random test function.

If the counter has reached zero, however, the FGP continues to block 574 in which it closes all open prefetch loops, and continues to block 576 where it examines the data integrity buffer and creates integrity check functions. The FGP creates integrity check functions only if it has been commanded to do so by the data in Field 3 406.

In block 576, the FGP examines the data integrity buffer for all cache memory locations that have been changed by the test functions the FGP created when the simulator runs the compiled test file. When the FGP finds a cache memory location that has been changed, it creates a data integrity function that reads the data from the cache memory location and compares it with the data in the data integrity buffer. This is possible since, as described above with relation to block 558, the FGP maintains a copy of what should be in each cache memory location in its data integrity buffer. As a result of this constant normal-function-by-normal-function updating, the data integrity buffer contains an accurate snapshot of the cache memory locations at all times.

Due to the random function creation process, it is unlikely that all cache memory locations have been written to by the end of the test, and thus it is unlikely that every cache memory location is represented in the data integrity buffer (since the data integrity buffer only contains the constants of cache memory locations that have been changed by functions. Some cache memory locations may have been written to more than once, others may not have been written to at all. There is no way to tell which locations will be changed from the beginning of the function creation process because the functions are randomly created on the fly, one at a time, as the FGP executes by randomly selecting a function from the function list and randomly selecting cache memory location parameters where those functions will store data.

As a result, the FGP creates a random number of functions between each successive write to the same cache memory location. It also creates a random number of functions between each successive cache memory write function.

To provide data verification the FGP creates integrity check functions in block 576 that read back the contents of the memory locations stored in the data integrity buffer. Since some of the functions written to functions may have been bitwise writes, not all the data in an individual word location of the cache memory may be changed when the function is executed. To access words in the cache memory that have only been partially written to (i.e. less than all the word's bits have been written), the FGP creates integrity check functions that incorporate bitwise read commands to bitwise read those bits that were changed and not to read the bits that were not changed.

The FGP completes its operations by writing the integrity check functions to the output buffer, and writing the output buffer to the test source file (block 578).

The above description of FIG. 5A-FIG. 5E completes the detailed discussion of the FGP shown in block 302 of FIG. 3.

Once the test source file has been created and closed by the FGP, it is compiled (FIG. 3, block 304) and passed to the hardware or software simulator (block 306) for actual simulation and testing (block 308).

In block 308, the simulator executes the test functions in the test file, causing the cache to (among other things) change the contents of its memory locations. After all the test functions in the test file have been executed, the simulator executes any integrity check functions in the test file.

The integrity check functions cause the simulator to read the data from the cache memory locations and to compare that data to data in the integrity check functions. The data in the integrity check functions are the data earlier stored in the data integrity buffer when the FGP was creating the test file now being executed by the simulator.

After comparing the contents of the cache memory location with the data in the integrity test functions, the simulator is configured to indicate whether the two are or are not equal—in other words, whether the cache memory location data is correct or not. If it is not correct, the cache is deemed to have failed the test.

Having thus described the preferred embodiments of the present invention, those of skill in the art will readily appreciate that the teachings found herein may be applied to yet other embodiments within the scope of the claims hereto attached.

For example, the FGP in the present example does not compile the functions into a form that can be directly accessed by the hardware or software simulator. It could be revised to have this compilation capability by incorporating the compilation features of the port driver compiler. Unless a claim explicitly require a separate compiler, this arrangement is considered to fall within the scope of the claim.

As another alternative example, the FGP could interactively request the operator to supply some or all of the parameter in the test settings file. Unless a claim explicitly excludes such interactive operation, this alternative arrangement is also considered to fall within the scope of the claim.

In yet another alternative example, the FGP may read two or more test settings files, acquiring test parameters from each. This arrangement, too, is considered to fall within the scope of a claim unless the claim explicitly excludes it.

In another example, one or more of the test parameters in the test settings file may be incorporated directly in the FGP, thus permitting the FGP to run without first acquiring the test parameters from the test settings file. Unless a claim explicitly calls for the test settings file, this too is considered to fall within the scope of the claim.

In another example, some of the numeric values selected at random need not be selected at random but may be provided to the FGP interactively, or be built into the FGP or be provided via a test settings file. Unless a claim states that specific numeric values must be randomly selected, non-random selection of those numeric values is also considered to fall within the scope of the claims.

In a further example, the FGP may not merely create a file with functions that are written in a plain text higher-level language form (hence the term test "source" file, above), but may itself convert or compile this file into another form that is not readily readable, but is directly useable by the software or hardware simulator.

Alternatively, the hardware or software simulator may be configured to take the test file generated by the FGP in a readable higher level language form and use it directly without an intermediate step of file conversion between the creation of the test file by the FGP and the use of that test file by the simulator.

I claim:

1. A computer system supported method for preparing a test source file for verifying the performance of a simulated cache memory integrated circuit device design, comprising the steps of:
   sequentially and randomly creating a series of functions;
   updating a data integrity buffer after each function of said series of functions is created;
   creating a series of integrity check functions from said data integrity buffer; and
   writing said series of functions and said series of integrity check functions to a test file for verifying the performance of the simulated cache memory integrated circuit device design.

2. The method of claim 1, wherein the data integrity buffer includes a plurality of records, each record of said plurality of records including a cache memory address associated with contents of that cache memory address.

3. The method of claim 2, wherein an address of said each record and contents of said each record are generated at random.

4. The method of claim 3, wherein the data integrity buffer is updated after a normal function is created in said series of functions.

5. The method of claim 4, wherein at least one of the series of functions includes a bitwise memory write operation to a partial word cache memory location and wherein a corresponding integrity check function includes a bitwise memory read operation to read said partial word cache memory location.

6. The method of claim 2, further comprising the steps of reading an entire test settings file into an input buffer before the step of sequentially and randomly creating a series of functions, and further wherein the step of sequentially and randomly creating includes the step of using parameter data from the test settings file to create said series of functions.

7. The method of claim 6, wherein the test settings file includes data directing the generation of prefetch loops.

8. The method of claim 3, wherein the address of each record and the contents of each record are generated at random using a Mitchell-Moore Additive generation method.

9. A digital storage medium having stored thereon a sequence of digital instructions executable by a computer to configure the computer to prepare a test source file for use in verifying the contents of a simulated cache memory integrated circuit device design, the digital instructions defining a sequence of steps for:
   sequentially and randomly creating a series of functions;
   updating a data integrity buffer in said computer after each function of said series of functions is created;
   creating a series of integrity check functions from said data integrity buffer; and
   writing said series of functions and said series of integrity check functions to a test file for use in verifying the contents of the simulated cache memory integrated circuit device design.

10. The digital storage medium of claim 9, wherein the data integrity buffer includes a plurality of records, each record including a cache memory address associated with contents of that cache memory address.

11. The digital storage medium of claim 10, wherein an address of each record and contents of each record are generated at random.

12. The digital storage medium of claim 11, wherein the data integrity buffer is updated after a normal function is created in said series of functions.

13. The digital storage medium of claim 12, wherein at least one of the series of functions includes a bitwise memory write operation to a partial word cache memory location and wherein a corresponding integrity check function includes a bitwise memory read operation to read said partial word cache memory location.

14. The digital storage medium of claim 10, further comprising the steps of reading an entire test settings file into an input buffer before the step of sequentially and randomly creating a series of functions, and further wherein the step of sequentially and randomly creating includes the step of using parameter data from the test settings file to create said series of functions.

15. The digital storage medium of claim 14, wherein the test settings file includes data directing the generation of prefetch loops.

16. The digital storage medium of claim 11, wherein an address of each record and contents of each record are generated at random using a Mitchell-Moore Additive generation method.

17. A digital computer configured to prepare a test source file for verifying the performance of a simulated cache memory integrated circuit device design, said computer including:
   means for sequentially creating a series of functions;
   means for updating a data integrity buffer in said computer after each function of said series of functions is created;
   means for creating a series of integrity check functions from data in said data integrity buffer; and
   means for writing said series of functions and said series of integrity check functions to a test file for verifying the performance of the simulated cache memory integrated circuit device design.

18. The computer of claim 17, further comprising means for providing test settings to said means for sequentially creating the series of functions.

19. The computer of claim 18, wherein the data integrity buffer includes a plurality of records, each record including a cache memory address associated with contents of that cache memory address, and further wherein the digital computer further includes means for randomly generating an address of each record and contents of each record are generated at random.

20. The computer of claim 19, further comprising means for updating the data integrity buffer.

21. The computer of claim 20, wherein the means for updating the data integrity buffer includes means for updating the data integrity buffer after a normal function is created in said series of functions.

22. The computer of claim 21, wherein means for providing test settings to said means for sequentially creating the series of functions includes means for directing the generation of prefetch loops.

\* \* \* \* \*